United States Patent
Cline et al.

[11] Patent Number: 5,883,459
[45] Date of Patent: Mar. 16, 1999

[54] ELECTRICAL SWITCH ASSEMBLY ENCAPSULATED AGAINST MOISTURE INTRUSION

[75] Inventors: David J. Cline, Newport Beach; Paul Rosenau, Santa Ana, both of Calif.

[73] Assignee: Balboa Instruments Inc., Costa Mesa, Calif.

[21] Appl. No.: 897,666

[22] Filed: Jul. 21, 1997

[51] Int. Cl.⁶ .................................................. H01L 41/08
[52] U.S. Cl. ........................ 310/339; 310/330; 310/324; 200/181
[58] Field of Search ................................. 310/330, 324, 310/340, 339; 200/181

[56] References Cited

U.S. PATENT DOCUMENTS

| | | |
|---|---|---|
| 2,587,304 | 2/1952 | Fiske, Jr. et al. . |
| 3,206,647 | 9/1965 | Kahn . |
| 3,210,701 | 10/1965 | Fastener et al. . |
| 3,239,696 | 3/1966 | Burkhalter et al. . |
| 3,307,052 | 2/1967 | Neilson et al. . |
| 3,387,149 | 6/1968 | Young . |
| 3,484,536 | 12/1969 | Jaeschke et al. . |
| 3,564,303 | 2/1971 | Geil . |
| 3,659,615 | 5/1972 | Enger . |
| 3,763,464 | 10/1973 | Laurent . |
| 3,935,485 | 1/1976 | Yashida et al. . |
| 3,965,065 | 6/1976 | Elliott . |
| 4,079,511 | 3/1978 | Grabbe . |
| 4,092,487 | 5/1978 | Imai . |
| 4,190,785 | 2/1980 | Kompanek . |
| 4,250,342 | 2/1981 | Fierkens . |
| 4,327,369 | 4/1982 | Kaplan . |
| 4,330,637 | 5/1982 | Wong . |
| 4,396,796 | 8/1983 | Wong . |
| 4,618,797 | 10/1986 | Cline . |
| 5,283,816 | 2/1994 | Diaz ........................................... 379/40 |
| 5,332,944 | 7/1994 | Cline ...................................... 310/339 |
| 5,539,166 | 7/1996 | Reier . |

*Primary Examiner*—Thomas M. Dougherty
*Attorney, Agent, or Firm*—Joseph F. McLellan

[57] ABSTRACT

An electrical switch assembly that is especially useful in a damp or moisture laden atmosphere. It can be used to operate remotely located electrical equipment, including household garbage disposers, hot tubs, spas and swimming pools. The assembly includes a receptacle and a piezoelectric element that is carried by an insert slidably fitted within the receptacle. Conductive wires in engagement with the element extend into a recess in the insert for engagement with a plug in the recess. Resiliently deformable potting material is poured through passageways in the insert to fill the insert and the receptacle, and to surround the element and the plug to prevent moisture entry. An end wall of the receptacle can be depressed to deform the element to generate electrical signals which are picked up by the plug and transmitted to an exterior control to operate the electrical equipment.

15 Claims, 2 Drawing Sheets

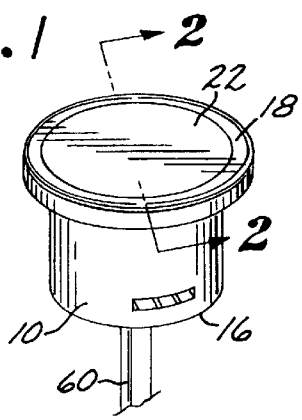
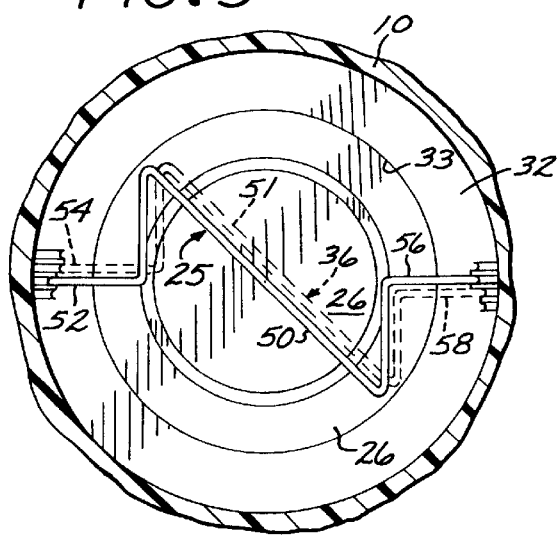
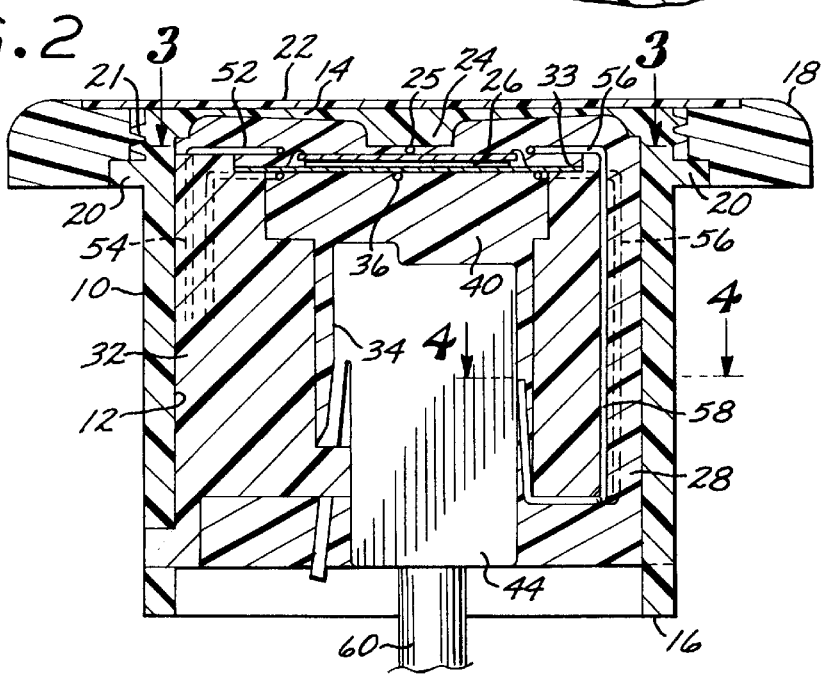
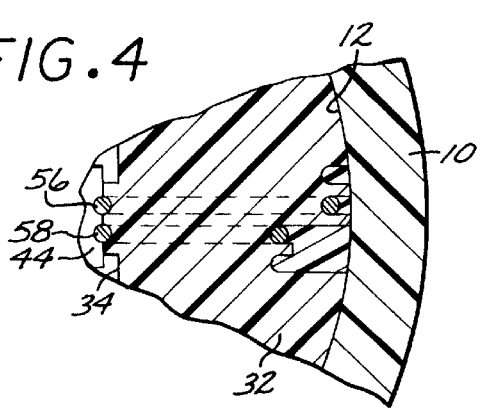
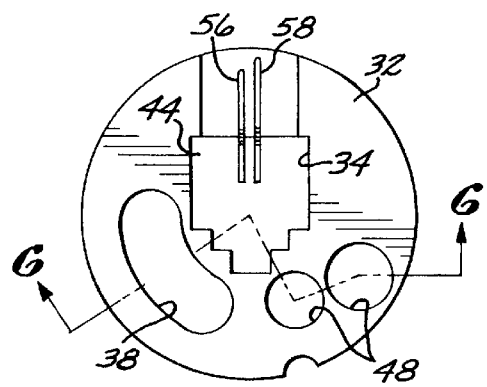

ELECTRICAL SWITCH ASSEMBLY ENCAPSULATED AGAINST MOISTURE INTRUSION

FIELD OF THE INVENTION

The present invention relates to an electrical switch assembly encapsulated against moisture intrusion, and more particularly to such an assembly having a piezoelectric element deformable within a resiliently flowable encapsulating material for generating an electrical signal to operate remotely located electrical equipment.

DESCRIPTION OF THE PRIOR ART

Electronic components are susceptible to corrosion damage by moisture, and it is common to encapsulate components such as transistors and even entire circuit boards to seal them off from corrosive environments. Encapsulating or potting materials for this purpose are well known in the art.

However, most electrical switches include a component which is movable to make or break mechanical contacts. Most forms of encapsulation interfere with such movement. Consequently, resort has been had to totally enclosing the electrical switch in a waterproof housing, but this has proved to be an expensive expedient, and one which is prone to failure because of the need to use sealing members such as rubber boots, O-rings, gaskets and the like which deteriorate over a period of time.

The systems disclosed in U.S. Pat. Nos. 4,618,797 and 5,332,944, issued to co-inventor Dave J. Cline, are effective to overcome the foregoing deficiencies of the prior art by employing a piezoelectric element that can be flexed or deformed in a resiliently flowable encapsulating material to generate an electrical signal for operating remotely located equipment. However, the manufacture, location and placement of certain system components involves procedures that can be time consuming.

More particularly, the system of the later patent U.S. Pat. No. 5,332,944 includes an enclosure which is filled with encapsulating material. A circuit board is held within the enclosure in relatively deeply recessed position by screw attachment to posts or standoffs that are integral with the enclosure. The circuit board supports a piezoelectric element that is deformable by pressing a touch panel on the outside of the enclosure. This moves an actuator whose shank engages the element. The presence of the touch panel is also effective to prevent extrusion of encapsulating material past the actuator to the exterior of the enclosure.

Conductive wires are soldered to the piezoelectric element and extend to the circuit board where they are soldered in place. Further wires attached to the circuit board extend to remotely located controls for operating electrical equipment such as swimming pool or spa pumps, blowers and heater controls, and the like.

The arrangement sometimes results in entrapment of air bubbles during filling of the enclosure with encapsulating material. The enclosure is purged of bubbles by maintaining it below atmospheric pressure until the bubbles migrate and escape to the environment.

SUMMARY OF THE INVENTION

According to the present invention, an electrical switch assembly is provided which includes piezoelectric means located within a hollow receptacle, and adapted to generate an electrical signal upon being flexed or deformed. One extremity or end wall of the receptacle can be pressed inwardly to engage and deform the piezoelectric element.

An insert is fitted within the receptacle and includes a recess which is adapted to receive a telephone-type plug.

A pair of conductors in the form of resilient wires are arranged to engage the opposite sides of the piezoelectric element. One of the extremities of each of the wires is arranged to extend from the element, through troughs or grooves in the side of the insert, at which point such extremities are reversely formed to extend into the insert recess where they can be engaged in a wiping contact action by the complemental conductors of a telephone-type plug. The arrangement eliminates any need for a circuit board within the receptacle.

The recess is provided with specially configured and located filling openings so that encapsulating material is enabled to flow and fill the spaces within the insert and receptacle, particularly surrounding the piezoelectric element and the associated electrical conductors. The filling arrangement permits air bubbles to freely migrate at atmospheric pressure and escape to the outside.

The switch assembly is easy to assemble by simply placing the piezoelectric element upon the insert, with the pair of contact wires resting against opposite sides of the element, inserting the element within the receptacle, where it is releasably locked in position with the wires held against the element, reversely forming the wires so they extend into the insert recess, pouring encapsulating material such as a potting gel into the assembly through the filling ports of the insert, and finally pushing the telephone-type plug into the insert recess to displace some of the potting gel and establish contact with the wires extending from the piezoelectric element. The gel selected is well known in the art for its resilient flowability so that it does not prevent the flexure of the piezoelectric element necessary to generate an electric signal.

Other aspects and advantages of the present invention will become apparent from the following more detailed description taken in conjunction with the accompanying drawings.

BRIEF DESCRIPTION OF THE DRAWINGS

FIG. 1 is a perspective view of an electrical switch assembly according to the present invention, as it would appear when filled with encapsulating material;

FIG. 2 is an enlarged view taken along the line 2—2 of FIG. 1;

FIG. 3 is a view taken along the line 3—3 of FIG. 2;

FIG. 4 is an enlarged view taken along the line 4—4 of FIG. 2;

FIG. 5 is a bottom plan view of the insert on a reduced scale;

DESCRIPTION OF A PREFERRED EMBODIMENT

Figure 6:
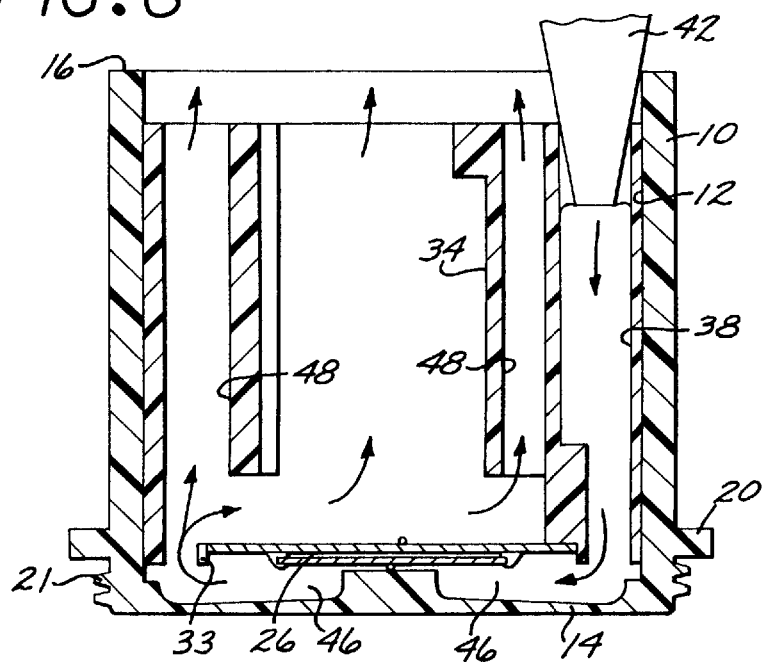
FIG. 6 is an enlarged view taken along the line 6—6 of FIG. 5, and illustrating the switch assembly in an upside down position prior to filling with encapsulating material.

Referring now to the drawings, the present electrical switch assembly comprises, generally, a cylindrical enclosure or receptacle 10 which is molded of electrically non-conductive material such as a rigid or inelastic plastic material. The receptacle 10 includes a hollow cylindrical space or interior 12 closed at the top by an end wall 14, and open at its opposite or lower extremity 16.

The upper periphery of the receptacle 18 includes external threads 21 extending down to a peripheral flange 20. An internally threaded top or cap 18 is threaded onto the threads 21 until the cap engages the peripheral flange 20. In this position a flexible touch panel or disk 22 secured within a shallow upper recess of the cap 18 overlies the end wall 14.

The disk 22 preferably carries indicia (not shown) which identifies the function of the associated switch assembly. For example, "PUMP" would indicate that pressing upon the disk 22 will initiate operation of a remotely located component such as a spa pump (not shown). As will be apparent, similar indicia could be used to designate a blower, heater or the like.

A number of such switch assemblies can be located in a single control panel (not shown) for placement next to the spa, where it is readily accessible to a user. The user can then operate any one or more components by merely pressing the disk 22 associated with the particular spa component that is to be operated. The switch assembly or assemblies are electrically isolated from the power circuits that actually operate the spa components so that there is no exposure of the user to shock hazards.

Although spa and swimming pool components such as pumps, blowers, heaters and the like have been mentioned by way of example, the present switch assemblies are equally adapted for the operation of all manner of remotely located components, particularly including household items such as dishwashers, garbage disposers and the like. These are typically operated by on-off switches that directly interrupt the power circuit to the item. A short circuit in the on-off switch can thus be a shock hazard to the user. The system of the present switch assembly eliminates any such hazard.

Many other applications for the present switch assemblies will immediately suggest themselves to those skilled in the art, and all such applications are intended to be within the scope of the present invention.

In the switch assembly illustrated; the end wall 14 is sufficiently thin that it can be resiliently deflected downwardly by applying slight pressure to the disk 22. Preferably the end wall 14 includes a centrally located, downwardly directed actuator or projection 24 which concentrates any pressing force to a confined area. As will be seen, the pressing force acts upon a resilient electrical conductor or wire 25 which overlies and engages a sensor, transducer or piezoelectric assembly 26. The wire transmits the force to the assembly 26, deflecting or deforming it to generate an electrical signal.

Generation of such a signal by even slight bending or deforming of a piezoelectric means is well known. The amount of deflection necessary can be as little 0.02 millimeters. This makes the present switch assembly quite sensitive to slight pressures exerted by a user upon the disk 22.

The piezoelectric assembly 26 is preferably circularly configured and comprises upper and lower disks of electrically conductive material whose opposite faces are electrically coupled by a thin layer of a suitable adhesive material such as epoxy that has very low electrical resistance.

The specific construction, thickness and configuration of the assembly 26 is not critical to the proper operation of the present electrical assembly as long as the assembly is effective to generate the desired electrical output pulse or signal upon undergoing slight bending or deformation.

The switch assembly is normally vertically oriented, and such terms as "lower", "upper", "downwardly"and "upwardly" are used in this disclosure merely for convenience. Such terms are intended to comprehend equivalent directions in the event the switch is oriented horizontally or otherwise.

As best seen in FIG. 2, the lower disk of the piezoelectric assembly 26 rests upon a resilient lower electrical conductor or wire 36 similar to the wire 25 which engages the upper disk of the assembly. However, the wire 36 is supported upon a circumferential shelf or seat 33 provided in a cylindrical insert 32. The wires 25 and 36 are the conductors which pick up the characteristic electrical signal that is generated when the assembly 26 is deflected or deformed.

The insert 32 is slidably fitted within the hollow interior 12 of the receptacle through its open lower end 16. It includes a central plug recess 34 that is downwardly open and thereby accessible through the open lower end 16 of the receptacle 10. This permits receipt of a telephone style plug 44, as will be seen.

Figure 7:
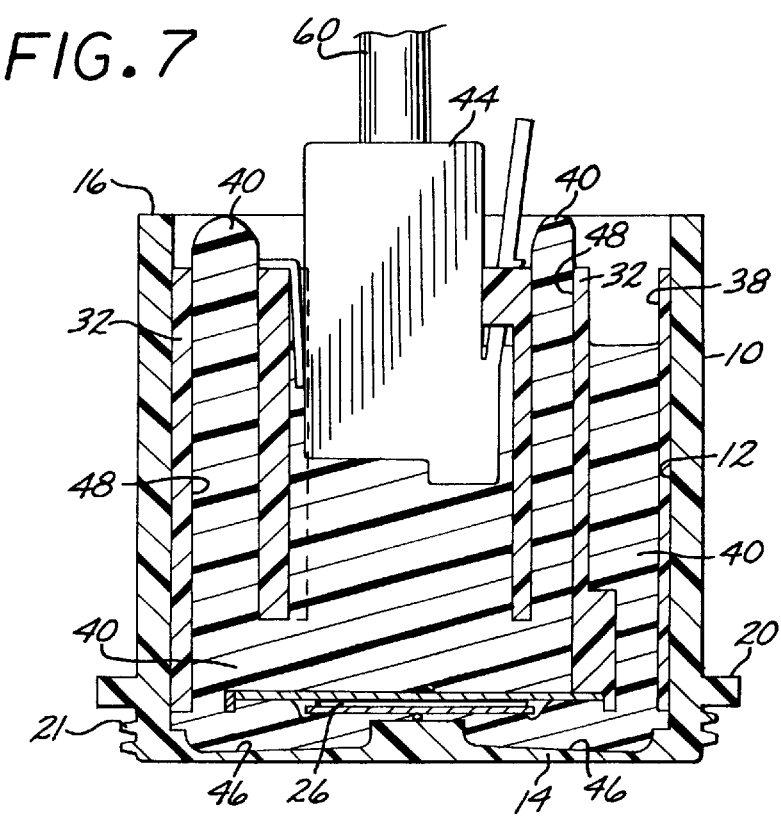
FIG. 7 is a view similar to FIG. 6, but illustrating the switch assembly after filling with encapsulating material, and showing the telephone-type plug partially disposed within the insert recess.

The insert 32 also includes a generally vertically oriented filling passage 38 which, as best seen in FIGS. 6 and 7, can be filled in an inverted position of the insert 32 with a resiliently deformable potting means or gel 40 from a suitable filling device 42. The gel 40 is able to flow downwardly through the passage 38 into spaces 46 which are located adjacent the upper disk of the piezoelectric assembly 26. From there the gel can flow laterally through the spaces 46, then down and laterally across the lower disk of the assembly 26. The flow can then continue upwardly through vertically oriented filling passages 48, and through the plug recess 34.

It has been found that this arrangement of filling passages enables the potting gel 40 in its liquid state to easily flow into and occupy the spaces just mentioned without the entrapment of air bubbles. The presence of such bubbles is undesirable because of their potential adverse affect upon the integrity of the waterproof gel barrier. It has been found that such bubbles can be eliminated by using the described configuration and arrangement of filling passages. There is no need to place the switch assembly in a vacuum chamber to rid it of such unwanted air bubbles.

The potting gel 40 is resiliently deformable, resistant to moisture, and should be selected for resistance to whatever harmful chemicals are anticipated in the operating environment. The degree of resilient deformability must be such that it will permit the desired deflection of the piezoelectric assembly 26, but also sufficient to aid in returning the assembly 26 to its undeflected state when the deflecting force is removed.

A silicone dielectric gel, marketed by Dow Corning as Q3-6527 A and B, has been found to give good results. It is a high dielectric substance and totally hydrophobic or resistant to water penetration.

After the gel 40 is poured into the open spaces in the switch assembly, the telephone style plug 44 is pushed into the recess 12. Partial insertion of the plug and displacement of the gel is seen in FIG. 6, whereas FIG. 1 shows the plug fully inserted, and the disposition of the gel after it sets up or cures. In its cured state the gel is resiliently deformable but it is not liquid so that it cannot leak or flow out of the receptacle 10.

The telephone style plug 44 is preferred because it not only operates satisfactorily, but it is readily available on the market. Such plugs are common for connecting telephone lines to a telephone base, for example, and for connecting the base to a handset. Of course, any male connector could be used if it has contacts adapted to be engaged by the wires 25 and 36.

The plug 44 is characterized by conductors or wires carried in recessed relation within seats or grooves that extend along one side of the plug. This location adapts the wires for wiping or slidable connection to the complemental wires 25 and 36 of the piezoelectric assembly 26.

More particularly, as best seen in FIGS. 2, 3 and 4, the upper wire 25 includes a generally Z-shaped midportion 50 which engages and overlies the upper face of the assembly 26. In similar fashion, the lower wire 36 includes a generally Z-shaped midportion 51 which engages and underlies the lower face of the assembly 26.

The outer or left end extremities 52 and 54 of the wires 25 and 36, respectively, extend to the left, as seen in FIGS. 2–4, then bend downwardly, extending about halfway down the insert 32 within suitable orienting grooves that are provided in the outer surface of the insert.

The opposite outer or right end extremities 56 and 58 of the wires 25 and 36, respectively, extend to the right, also bend downwardly, extending within suitable orienting grooves provided in the outer surface of the insert. However, these right end extremities 56 and 58 extend downwardly the full depth of the insert and, at the bottom of the insert, they are reversely formed to extend upwardly inside the plug recess 34. In this position they are adapted to engage the complemental conductors of the plug 44 when it is inserted into the recess 34.

This engagement is adapted to carry any signals from the piezoelectric assembly 26 through a connecting cable 60 to a remotely located circuit board and system (not shown), where the signals are amplified sufficiently to operate the associated spa, swimming pool, household, etc. components.

In operation, the present switch assembly is actuated by manually depressing the flexible disk 22. This moves the projection 24 of the receptacle end wall 14 downwardly to deflect the piezoelectric assembly 26 and the associated supporting wires 25 and 36. The downward deflection of the assembly 26 displaces adjacent potting gel 40, which resiliently deforms or "flows" out from the flexure spaces 46 between the assembly 26 and the overlying receptacle end wall 14 to other areas filled with the gel. The degree of deformation is relatively small, but it is sufficient to permit the desired mechanical flexure of the piezoelectric assembly 26 for generating the desired electrical signal.

Upon release of manual pressure, the disk 22, end wall 14 and assembly 26 return to their undeflected or previous states by reason of the resilience of the assembly 26, the end wall 14 and the wires 25 and 36. This return is also aided by the resilience of the potting gel 40, which acts upon the gel to return it to its original disposition.

With the foregoing arrangement, the switch assembly electrical contacts are located deep within the assembly, where they are electrically isolated from the exterior and protected from moisture and outside contaminants.

Although a specific embodiment of the invention has been described and illustrated, it will be understood that the invention is not to be limited to the specific forms or arrangement of parts described and illustrated, and that various changes can be made without departing from the scope of the appended claims.

What is claimed is:

1. An electrical switch assembly comprising:

hollow receptacle means closed at one extremity by a flexible portion, and having an oppositely located open extremity;

an insert fitted within the hollow receptacle means and including a recess adjacent the open extremity adapted to receive a plug, the insert further including filling passageways providing communication between the flexible portion and the open extremity;

piezoelectric means interposed between the flexible portion and the insert, and adapted to be flexed on inward flexing of the flexible portion for generating an electrical signal, the piezoelectric means including a first face and a second face;

first electrical conductor means located between the flexible portion and the piezoelectric means, and including a first contact portion extending into the recess of the insert whereby, upon insertion into the recess of a plug having a complemental contact portion, the respective contact portions of the first contact portion and the plug are engaged, the first electrical conductor means further including a resilient first wire having a midportion extending across the first face;

second electrical conductor means located between the piezoelectric means and the insert, and including a second contact portion extending into the recess of the insert whereby, upon insertion into the recess of a plug having a complemental contact portion, the respective contact portions of the second contact portion and the plug are engaged, the second electrical conductor means further including a resilient second wire having a mrtion extending across the second face; and resiliently deformable potting means extending through the filling passageways and substantially filling the spaces in the hollow receptacle means and the insert, the resilient deformability of the potting means enabling flexure of the piezoelectric means for generating an electrical signal.

2. An electrical switch assembly according to claim 1 wherein the insert includes a seat upon which the piezoelectric means rests, and further includes a first pair of grooves in the insert on one side of the seat which each receive one of the extremities of the first and second wires, and further includes a second pair of grooves in the insert opposite the first pair of grooves which each receive the other of the extremities of the first and second wires.

3. An electrical switch assembly according to claim 2 wherein the receptacle means is cylindrical, the insert is cylindrical and is slidably received within the receptacle means, and wherein the other of the extremities of the first and second wires are reversely formed to define the contact portions of the first and second electrical conductor means extending into the recess of the insert.

4. An electrical switch assembly according to claim 1 wherein the piezoelectric means is circular, and the midportions of the pair of first and second wires are Z-shape in configuration and extend from the first and second faces the piezoelectric means across the center of the piezoelectric means.

5. An electrical switch assembly according to claim 1 and including a plug in the recess of the insert, the plug having complemental contact portions engaged by the contact portions of the first and second electrical conductor means, the plug having electrical conductor means coupled to the complemental contact portions and extending externally of the electrical switch assembly for carrying electrical signals to external control means.

6. An electrical switch assembly comprising:

a hollow cylindrical receptacle including a flexible extremity and an opposite open extremity;

a cylindrical insert slidably fitted within the receptacle and including a plug recess adjacent the open extremity of the receptacle, the insert including filling passageways providing fluid communication between the flexible extremity and the open extremity of the receptacle;

disk shaped switch means located adjacent the flexible extremity and deformable upon flexing of the flexible extremity for generating an electrical signal;

electrically conductive first and second wires each having a midportion and short and long extremities, the midportions of the first and second wires extending across the upper and lower faces, respectively, of the switch means, the short and long extremities being carried by the insert at the opposite sides of the insert, the long extremities being reversely formed and terminating within the recess;

resiliently deformable potting means in the filling passageways, around the switch means, and in the recess for blocking the entry of moisture, the potting means enabling deformation of the switch means for generating an electrical signal.

7. An electrical switch assembly according to claim 6 wherein the first and second wires are made of resilient material.

8. An electrical switch assembly according to claim 6 wherein the midportions of the first and second wires are Z-shape in configuration and extend from opposite sides of the switch means across the center of the switch means.

9. An electrical switch assembly according to claim 6 wherein the first and second wires are free of attachment to the switch means.

10. An electrical switch assembly according to claim 6 wherein the flexible extremity of the receptacle includes an internal integral protuberance engaged upon the first wire overlying the switch means.

11. An electrical switch assembly according to claim 6 wherein the insert integrally includes a plurality of inwardly extending clips, and the receptacle includes a plurality of complemental openings which receive the clips to hold the insert in proper position within the receptacle.

12. An electrical switch assembly according to claim 6 and including a plug in the recess of the insert, the plug having contacts engaged upon the long extremities of the first and second wires, and extending externally of the electrical switch assembly for connection to external control means.

13. An electrical switch assembly according to claim 6 and including a circular flange threaded to the receptacle adjacent the flexible extremity for attachment of the flange to a supporting surface for fixedly mounting the switch assembly.

14. An electrical switch assembly comprising:

hollow receptacle means including a closed upper extremity having a flexible portion, and an oppositely located open lower extremity in communication with atmosphere;

piezoelectric means located adjacent the flexible portion for deflection upon flexure of the flexible portion for generating an electrical signal;

an insert fitted within the hollow receptacle and including a plug receiving recess, the insert further having passageway means extending downwardly from the open lower extremity to the upper closed extremity, across the flexible portion, and upwardly past the plug receiving recess to the open lower extremity;

first electrical conductor means located between the flexible portion and the piezoelectric means, and including a first contact portion extending into the plug receiving recess whereby, upon insertion of a plug having a complemental contact portion, the respective contact portions of the first contact portion and the plug are engaged;

second electrical conductor means located between the piezoelectric means and the insert, and including a second contact portion extending into the recess of the insert whereby, upon insertion into the recess of a plug having a complemental contact portion, the respective contact portions of the second contact portion and the plug are engaged; and resiliently deformable and flowable potting means substantially filling the filling passageway means and terminating adjacent the lower open extremity whereby any entrained gases in the filling passageway means are urged towards the open extremity and to atmosphere during filling of the filling passageway means by the potting means, the resilient deformability of the potting means enabling deflection of the piezoelectric means for generating an electrical signal.

15. An electrical switch assembly comprising:

hollow receptacle means including a closed upper extremity having a flexible portion, and an oppositely located open lower extremity, piezoelectric means having opposite sides located adjacent the flexible portion for deflection upon flexure of the flexible portion for generating an electrical signal;

an insert fitted within the hollow receptacle and including a plug receiving recess;

first electrical conductor means located adjacent one side of the piezoelectric means, and including a first contact portion extending into the plug receiving recess whereby, upon insertion into the recess of a plug having a complemental contact portion, the respective contact portions of the first contact portion and the plug are engaged;

second electrical conductor means located adjacent the opposite side of the piezoelectric means, and including a second contact portion extending into the plug receiving recess whereby, upon insertion into the recess of a plug having a complemental contact portion, the respective contact portions of the second contact portion and the plug are engaged;

resiliently deformable and flowable potting means substantially filling the filling passageway means and terminating adjacent the open lower extremity whereby any entrained gases in the filling passageway means are urged toward the open extremity and to atmosphere during filling of the filling passageway means by the potting means, the resilient deformability of the potting means enabling deflection of the piezoelectric means for generating an electrical signal; and electrical conductors connected to the complemental contact portions of the plug and extending externally of the receptacle means for connection to an external circuit board operative to amplify the electrical signal of the piezoelectric means for actuating externally located equipment.

* * * * *